(12) United States Patent
Wong et al.

(10) Patent No.: US 11,218,136 B2
(45) Date of Patent: Jan. 4, 2022

(54) POWER TRANSISTOR DRIVING METHOD, DRIVING CIRCUIT AND SWITCHING CIRCUIT

(71) Applicant: JOULWATT TECHNOLOGY (HANGZHOU) CO. LTD., Zhejiang (CN)

(72) Inventors: Pitleong Wong, Macau (CN); Liyu Lin, Zhejiang (CN); Xunwei Zhou, Zhejiang (CN)

(73) Assignee: JOULWATT TECHNOLOGY (HANGZHOU) CO. LTD., Hangzhou (CN)

( * ) Notice: Subject to any disclaimer, the term of this patent is extended or adjusted under 35 U.S.C. 154(b) by 0 days.

(21) Appl. No.: 17/095,773

(22) Filed: Nov. 12, 2020

(65) Prior Publication Data

US 2021/0152159 A1 May 20, 2021

(30) Foreign Application Priority Data

Nov. 15, 2019 (CN) .......................... 201911119090.5

(51) Int. Cl.
*H03K 3/012* (2006.01)

(52) U.S. Cl.
CPC .................................. *H03K 3/012* (2013.01)

(58) Field of Classification Search
CPC ............. H03K 3/012; H03K 17/04206; H03K 17/166; H03K 17/687; H03K 17/04123; H02M 1/088
See application file for complete search history.

(56) References Cited

U.S. PATENT DOCUMENTS 9,236,866 B2 * 1/2016 Youn .................... H02M 3/158

* cited by examiner

*Primary Examiner* — Sibin Chen
(74) *Attorney, Agent, or Firm* — Gang Yu

(57) ABSTRACT

The present disclosure provides a power transistor driving method, a driving circuit and a switching circuit. When the power transistor is an N-type component, a driving pole of the power transistor is pulled down in a first current, and when a time period recorded by the timer reaches a first time period, a pull-down switch is turned on or the driving pole of the power transistor is pulled down in a second current; the driving pole of the power transistor is pulled down by the pull-down switch; when a timer is started from a moment at which the power transistor is turned off, the first time period is higher than a time period from a moment at which a switching tube is turned off to a moment at which the change rate of the drain-source voltage of the power transistor along with the time is higher than the first slope.

5 Claims, 2 Drawing Sheets

POWER TRANSISTOR DRIVING METHOD, DRIVING CIRCUIT AND SWITCHING CIRCUIT

CROSS-REFERENCE TO RELATED APPLICATIONS

The present disclosure claims priority of Chinese Patent Application No. 201911119090.5, filed to China Patent Office on Nov. 15, 2019. Contents of the present disclosure are hereby incorporated by reference in entirety of the Chinese Patent Application.

TECHNICAL FIELD

The present disclosure relates to the field of power electronic technologies, and in particular to a power transistor driving method, a driving circuit and a switching circuit.

BACKGROUND

The control of a turn-off process of a power component in a switching power supply directly affects the reliability of the switching power supply. When the turn-off process of the power component is not handled properly, not only low system efficiency is caused, but also the power component is damaged, and a reliability of a system is affected. Therefore, how to reliably turn off a switching component is an important problem in power component driving.

SUMMARY

At least some embodiments of the present disclosure provide a power transistor driving method, a driving circuit and a switching circuit, so as at least to partially solve a problem in related art that a power component may not be turned off with high reliability.

In one embodiment of the present disclosure, a power transistor driving method is provided, when a power transistor is turned off or a change rate of a drain-source voltage of the power transistor along with time is higher than a first slope or the drain-source voltage of the power transistor is higher than a first voltage, a timer is started, and when the power transistor is an N-type component, a driving pole of the power transistor is pulled down in a first current, and when a time period recorded by the timer reaches a first time period, a pull-down switch of a power transistor driving circuit is turned on or the driving pole of the power transistor is pulled down in a second current, when detecting that the change rate of the drain-source voltage of the power transistor along with the time is higher than a second slope, the first time period corresponding to a next switching period is increased; when detecting that the change rate of the drain-source voltage of the power transistor along with the time is lower than or equal to the second slope, the first time period corresponding to the next switching period is decreased; the driving pole of the power transistor is pulled down by the pull-down switch; when the a timer is started from a moment at which the power transistor is turned off, the first time period is higher than a time period from a moment at which a switching tube is turned off to a moment at which the change rate of the drain-source voltage of the power transistor along with the time is higher than the first slope; and the second current is higher than the first current.

In one embodiment of the present disclosure, a power transistor driving circuit is further provided, when a power transistor is turned off or a change rate of a drain-source voltage of the power transistor along with time is higher than a first slope or the drain-source voltage of the power transistor is higher than a first voltage, a timer is started, and when the power transistor is an N-type component, a driving pole of the power transistor is pulled down in a first current by the power transistor driving circuit, and when a time period recorded by the timer reaches a first time period, a pull-down switch of the power transistor driving circuit is turned on or the driving pole of the power transistor is pulled down in a second current, when detecting that the change rate of the drain-source voltage of the power transistor along with the time is higher than a second slope, the first time period corresponding to a next switching period is increased; when detecting that the change rate of the drain-source voltage of the power transistor along with the time is lower than or equal to the second slope, the first time period corresponding to the next switching period is decreased; the driving pole of the power transistor is pulled down by the pull-down switch; and the second current is higher than the first current.

In one optional embodiment, the power transistor driving circuit includes a time detection circuit and a pull-down circuit, the time detection circuit is configured to receive the drain-source voltage of the power transistor, and output a voltage to represent whether the change rate of the drain-source voltage of the power transistor along with the time is higher than the second slope, the pull-down circuit is configured to receive an output voltage of the time detection circuit, and regulate the first time period according to the output voltage of the time detection circuit.

In one optional embodiment, the time detection circuit includes a first capacitance, a first switch and a first resistance, the first capacitance, the first switch and the first resistance are serially connected in turn; the first capacitance is configured to receive the drain-source voltage of the power transistor, when the driving pole of the power transistor is pulled down in the second current, the first switch is turned on, and when the driving pole of the power transistor is not pulled down in the second current, the first switch is turned off; and a voltage of the first resistance represents whether the change rate of the drain-source voltage of the power transistor along with the time is higher than the second slope.

In one optional embodiment, when the voltage of the first resistance is higher than a first voltage threshold, the change rate of the drain-source voltage of the power transistor along with the time is higher than the second slope.

In one embodiment of the present disclosure, a switching circuit is further provided.

Through adopting the circuit structure and method of the present disclosure, compared with the related art, it has the following advantages: a rapid turn-off process, high reliability and good electromagnetic compatibility.

DETAILED DESCRIPTION

Exemplary embodiments of the present disclosure are described in detail below in combination with drawings, but the present disclosure is not limited to these embodiments. Any replacements, modifications, equivalent methods and schemes made within spirit and scope of the present disclosure are included in the present disclosure.

In order to make the public understand the present disclosure completely, specific details are described in detail in the following preferred embodiments of the present disclosure, and the present disclosure may also be fully understood by those skilled in the art without the description of these details.

In the following paragraphs, the present disclosure is described in more detail by way of examples with reference to the drawings. It is to be noted that the drawings all adopt a relatively simplified form and all use imprecise proportions, and are used for a purpose of conveniently and clearly assisting to describe the embodiments of the present disclosure.

Figure 1:
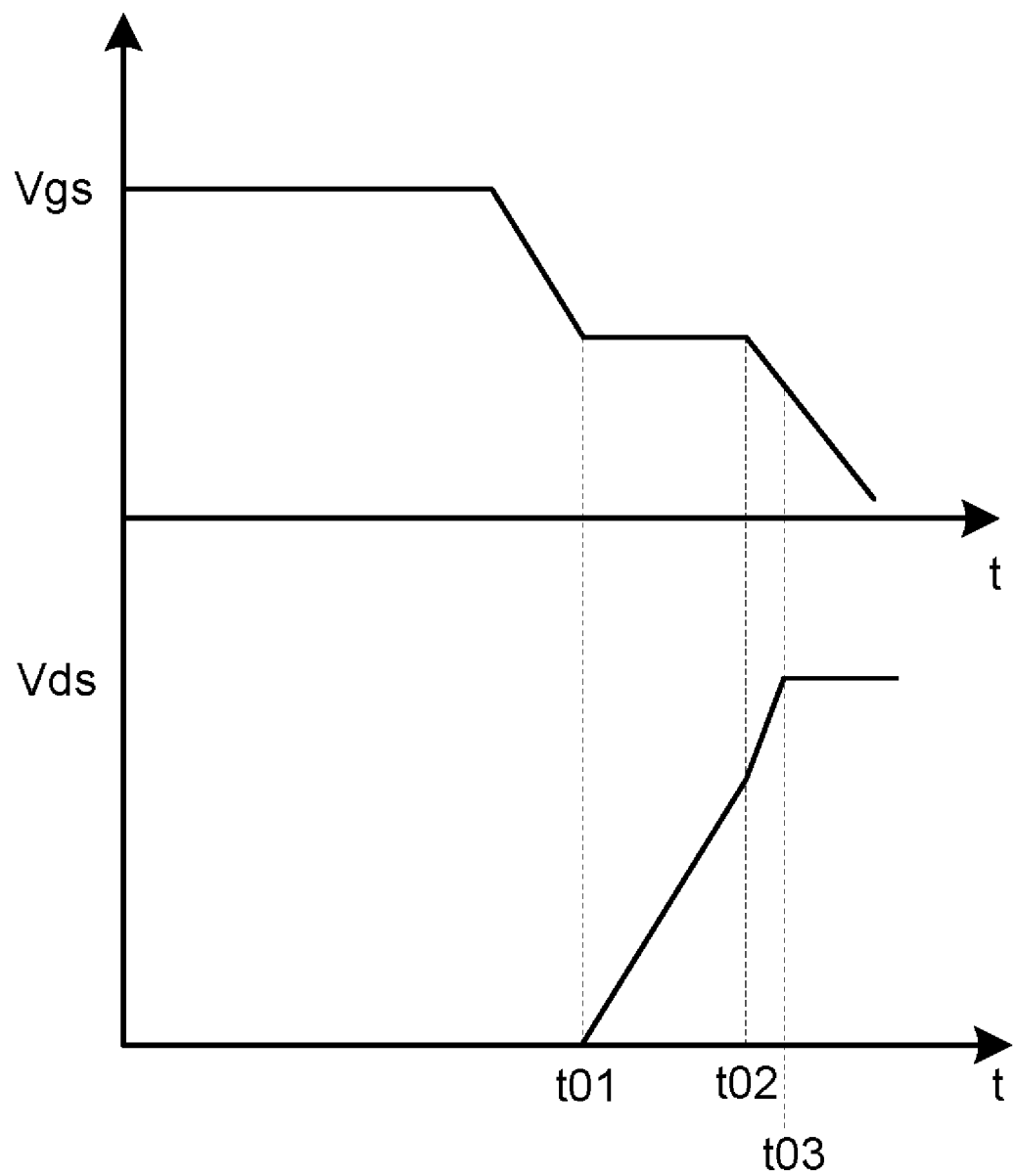
FIG. 1 is a schematic diagram of voltage waveforms of a driving pole relative to a source electrode and a drain electrode relative to the source electrode when a power transistor is turned off according to one embodiment of the present disclosure.

In one embodiment of the present disclosure, a power transistor driving method is provided. When a power transistor is turned off or a change rate of a drain-source voltage of the power transistor along with time is higher than a first slope or the drain-source voltage of the power transistor is higher than a first voltage, a timer is started. As shown in FIG. 1, when the a timer is started from a moment at which the change rate of the drain-source voltage of the power transistor along with the time is higher than the first slope or the drain-source voltage of the power transistor is higher than the first voltage, namely from a moment t01 or near the moment t01, and the power transistor is an N-type component, a driving pole of the power transistor is pulled down in a first current, namely the driving pole of the power transistor is pulled down in the first current within an interval of t01-t02. When a time period recorded by the timer reaches a first time period, at the moment t02, a pull-down switch of a power transistor driving circuit is turned on or the driving pole of the power transistor is pulled down in a second current. When detecting that the change rate of the drain-source voltage of the power transistor along with the time is higher than a second slope, the first time period of a next switching period is increased. When detecting that the change rate of the drain-source voltage of the power transistor along with the time is not higher than a second slope, the first time period of the next switching period is decreased. The driving pole of the power transistor is pulled down by the pull-down switch. When the a timer is started from the moment at which the power transistor is turned off, the first time period is higher than a time period from a moment at which a switching tube is turned off to a moment at which the change rate of the drain-source voltage of the power transistor along with the time is higher than the first slope. Namely, after the moment t01 as shown in FIG. 1, the timing of the first time period is ended, and before the moment t01, the timing of the first time period may not be ended. The second current is higher than the first current.

In one embodiment of the present disclosure, a power transistor driving circuit is provided, when a power transistor is turned off or a change rate of a drain-source voltage of the power transistor along with time is higher than a first slope or the drain-source voltage of the power transistor is higher than a first voltage, a timer is started. And when the power transistor is an N-type component, a driving pole of the power transistor is pulled down in a first current by the power transistor driving circuit. When a time period recorded by the timer reaches a first time period, a pull-down switch of the power transistor driving circuit is turned on or the driving pole of the power transistor is pulled down in a second current. When detecting that the change rate of the drain-source voltage of the power transistor along with the time is higher than a second slope, the first time period of a next switching period is increased. When detecting that the change rate of the drain-source voltage of the power transistor along with the time is not higher than a second slope, the first time period of the next switching period is decreased. The driving pole of the power transistor is pulled down by the pull-down switch. The second current is higher than the first current.

Figure 2:
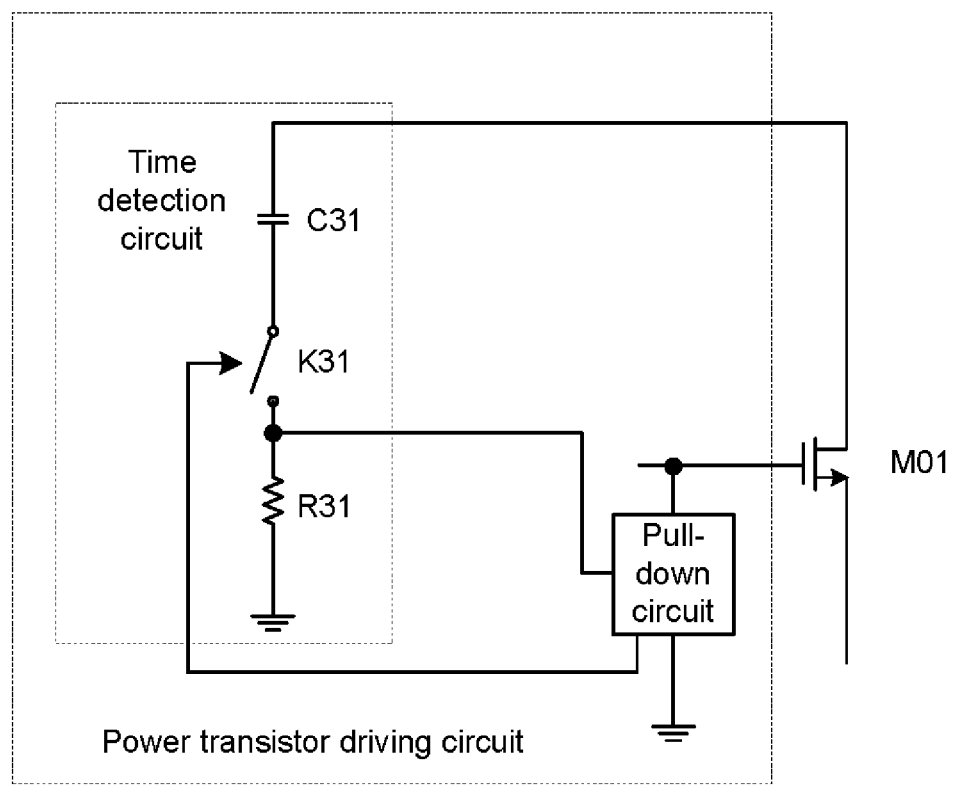
FIG. 2 is a schematic diagram of a power transistor driving circuit according to one embodiment of the present disclosure.

As shown in FIG. 2, the power transistor driving circuit includes a time detection circuit and a pull-down circuit. The time detection circuit is configured to receive the drain-source voltage of the power transistor, and output a voltage to represent whether the change rate of the drain-source voltage of the power transistor along with the time is higher than the second slope. The pull-down circuit is configured to receive the output voltage of the time detection circuit, and regulate the first time period according to the output voltage of the time detection circuit.

As shown in FIG. 2, the time detection circuit includes a first capacitance C31, a first switch K31 and a first resistance R31, the first capacitance C31, the first switch K31 and the first resistance R31 are serially connected in turn. The first capacitance C31 is configured to receive the drain-source voltage M01 of the power transistor. When the driving pole of the power transistor is pulled down in the second current, the first switch K31 is turned on. When the driving pole of the power transistor is not pulled down in the second current, the first switch K31 is turned off. And a voltage of the first resistance represents whether the change rate of the drain-source voltage of the power transistor along with the time is higher than the second slope. When the voltage of the first resistance is higher than a first voltage threshold, the change rate of the drain-source voltage of the power transistor along with the time is higher than the second slope. When the change rate of the drain-source voltage of the power transistor along with the time is higher than the second slope, the first time period corresponding to the next switching period is increased. When detecting that the change rate of the drain-source voltage of the power transistor along with the time is lower than or equal to the second slope, the first time period corresponding to the next switching period is decreased.

In one embodiment of the present disclosure, a switching circuit is further provided. The switching circuit includes the above power transistor driving circuit.

Although the embodiments are described and illustrated separately above, some common technologies are related. Replacements and integrations may be made between the embodiments in the eyes of those of ordinary skill in the art, and the content related that is not clearly recorded in one embodiment may reference to another embodiment with the record.

The above implementation modes do not constitute limitation on the scope of protection of the technical scheme. Any modifications, equivalent replacements and improvements and the like made within the spirit and principle of the above implementation modes should be included in the scope of protection of the technical scheme.

What is claimed is:

1. A power transistor driving method, applied to a power transistor driving circuit, wherein when a power transistor is turned off or a change rate of a drain-source voltage of the power transistor along with time is higher than a first slope or the drain-source voltage of the power transistor is higher than a first voltage, a timer is started, and when the power transistor is an N-type component, a driving pole of the power transistor is pulled down in a first current, and when a time period recorded by the timer reaches a first time period, a pull-down switch of a power transistor driving circuit is turned on or the driving pole of the power transistor is pulled down in a second current, when detecting that the change rate of the drain-source voltage of the power transistor along with the time is higher than a second slope, the first time period corresponding to a next switching period is increased; when detecting that the change rate of the drain-source voltage of the power transistor along with the time is lower than or equal to the second slope, the first time period corresponding to the next switching period is decreased; the driving pole of the power transistor is pulled down by the pull-down switch; when the timer is started from a moment at which the power transistor is turned off, the first time period is higher than a time period from a moment at which a switching tube is turned off to a moment at which the change rate of the drain-source voltage of the power transistor along with the time is higher than the first slope; and the second current is higher than the first current;

wherein the power transistor driving circuit comprises a time detection circuit and the time detection circuit is configured to receive the drain-source voltage of the power transistor, and output a voltage to represent whether the change rate of the drain-source voltage of the power transistor along with the time is higher than the second slope;

wherein the time detection circuit comprises a first capacitance, a first switch and a first resistance, the first capacitance, the first switch and the first resistance are serially connected in turn; the first capacitance is configured to receive the drain-source voltage of the power transistor, when the driving pole of the power transistor is pulled down in the second current, the first switch is turned on, and when the driving pole of the power transistor is not pulled down in the second current, the first switch is turned off; and a voltage of the first resistance represents whether the change rate of the drain-source voltage of the power transistor along with the time is higher than the second slope.

2. The power transistor driving circuit as claimed in claim 1, wherein when the voltage of the first resistance is higher than a first voltage threshold, the change rate of the drain-source voltage of the power transistor along with the time is higher than the second slope.

3. A power transistor driving circuit, wherein when a power transistor is turned off or a change rate of a drain-source voltage of the power transistor along with time is higher than a first slope or the drain-source voltage of the power transistor is higher than a first voltage, a timer is started, and when the power transistor is an N-type component, a driving pole of the power transistor is pulled down in a first current by the power transistor driving circuit, and when a time period recorded by the timer reaches a first time period, a pull-down switch of the power transistor driving circuit is turned on or the driving pole of the power transistor is pulled down in a second current, when detecting that the change rate of the drain-source voltage of the power transistor along with the time is higher than a second slope, the first time period corresponding to a next switching period is increased; when detecting that the change rate of the drain-source voltage of the power transistor along with the time is lower than or equal to the second slope, the first time period corresponding to the next switching period is decreased; the driving pole of the power transistor is pulled down by the pull-down switch; and the second current is higher than the first current;

wherein the power transistor driving circuit comprises a time detection circuit and the time detection circuit is configured to receive the drain-source voltage of the power transistor, and output a voltage to represent whether the change rate of the drain-source voltage of the power transistor along with the time is higher than the second slope;

wherein the time detection circuit comprises a first capacitance, a first switch and a first resistance, the first capacitance, the first switch and the first resistance are serially connected in turn; the first capacitance is configured to receive the drain-source voltage of the power transistor, when the driving pole of the power transistor is pulled down in the second current, the first switch is turned on, and when the driving pole of the power transistor is not pulled down in the second current, the first switch is turned off; and a voltage of the first resistance represents whether the change rate of the drain-source voltage of the power transistor along with the time is higher than the second slope.

4. The power transistor driving circuit as claimed in claim 3, wherein the power transistor driving circuit further comprises a pull-down circuit, the pull-down circuit is configured to receive an output voltage of the time detection circuit, and regulate the first time period according to the output voltage of the time detection circuit.

5. A switching circuit, comprising a power transistor driving circuit, wherein when a power transistor is turned off or a change rate of a drain-source voltage of the power transistor along with time is higher than a first slope or the drain-source voltage of the power transistor is higher than a first voltage, a timer is started, and when the power transistor is an N-type component, a driving pole of the power transistor is pulled down in a first current by the power transistor driving circuit, and when a time period recorded by the timer reaches a first time period, a pull-down switch of the power transistor driving circuit is turned on or the driving pole of the power transistor is pulled down in a second current, when detecting that the change rate of the drain-source voltage of the power transistor along with the time is higher than a second slope, the first time period corresponding to a next switching period is increased; when detecting that the change rate of the drain-source voltage of the power transistor along with the time is lower than or equal to the second slope, the first time period corresponding to the next switching period is decreased; the driving pole of the power transistor is pulled down by the pull-down switch; and the second current is higher than the first current;

wherein the power transistor driving circuit comprises a time detection circuit and the time detection circuit is configured to receive the drain-source voltage of the power transistor, and output a voltage to represent whether the change rate of the drain-source voltage of the power transistor along with the time is higher than the second slope;

wherein the time detection circuit comprises a first capacitance, a first switch and a first resistance, the first capacitance, the first switch and the first resistance are serially connected in turn; the first capacitance is configured to receive the drain-source voltage of the power transistor, when the driving pole of the power transistor is pulled down in the second current, the first switch is turned on, and when the driving pole of the power transistor is not pulled down in the second current, the first switch is turned off; and a voltage of the first resistance represents whether the change rate of the drain-source voltage of the power transistor along with the time is higher than the second slope.

* * * * *